(12) United States Patent
Fan et al.

(10) Patent No.: US 6,735,130 B2
(45) Date of Patent: May 11, 2004

(54) DIFFERENTIAL VOLTAGE MEMORY BUS

(75) Inventors: Renyong Fan, Cupertino, CA (US); Zhaohua Xiao, San Jose, CA (US)

(73) Assignee: Spreadtrum Communications Corporation, Santa Clara, CA (US)

( * ) Notice: Subject to any disclaimer, the term of this patent is extended or adjusted under 35 U.S.C. 154(b) by 0 days.

(21) Appl. No.: 10/146,506

(22) Filed: May 14, 2002

(65) Prior Publication Data

US 2003/0214849 A1 Nov. 20, 2003

(51) Int. Cl.$^7$ ................................................. G11C 7/00
(52) U.S. Cl. ............. 365/198; 365/189.07; 365/189.05; 327/336
(58) Field of Search ................................. 365/198, 191, 365/189.05, 189.07, 207, 190, 227; 327/336, 393, 403; 375/275, 317, 259, 286, 257; 326/86; 341/56, 26, 144, 155; 370/421, 463, 524

(56) References Cited

U.S. PATENT DOCUMENTS

| | | | | | |
|---|---|---|---|---|---|
| 4,860,309 | A | * | 8/1989 | Costello | 375/286 |
| 5,535,165 | A | * | 7/1996 | Davis et al. | 365/201 |
| 6,166,971 | A | * | 12/2000 | Tamura et al. | 365/198 |
| 6,396,329 | B1 | * | 5/2002 | Zerbe | 327/336 |
| 6,477,205 | B1 | * | 11/2002 | Doblar et al. | 375/259 |

* cited by examiner

*Primary Examiner*—Gene Auduong
(74) *Attorney, Agent, or Firm*—Perkins Coie LLP

(57) ABSTRACT

A method of communicating between a memory and circuitry on an integrated circuit is disclosed. The method comprises converting a first input signal from the memory to a first differential output signal dependent upon the first input signal. The first input signal is a full swing signal. The first differential output signal is propagated to the circuitry using a pair of first signal lines. Finally, at the circuitry, the first differential output signal is converted into a first received signal, which is a full swing signal.

7 Claims, 3 Drawing Sheets

DIFFERENTIAL VOLTAGE MEMORY BUS

TECHNICAL FIELD

The present invention relates to a memory bus, and more particularly, to a differential bus with a self-timing transceiver.

BACKGROUND

Modern electronic devices utilize memory to store instructions and data which are necessary to make the electronics function properly. For example, in the wireless communications context, the integrated circuits used to implement wireless communications require memory for storing system parameters, configuration information, and various other types of information. One common memory type is the programmable read-only memory (PROM). PROM memory is most often used to store the initial code for starting the electronic device and for configuration information. Another common type of memory is the static random access memory (SRAM) which provides fast data storage and retrieval time and is commonly used during operation of the electronic device.

The memory can be a stand-alone integrated circuit or in other applications be integrated into a more complex single integrated circuit. For example, in the modern system-on-a-chip (SOC), these types of integrated circuits include processors, memory, and other types of functional elements. In any event, data is communicated between the memory and other functional elements by one or more memory busses. For many applications, such as portable electronic devices, low power consumption is a desirable attribute. For large configuration memories, the memory bus may consume over 30% of the total power.

Therefore, what is needed is a memory bus design for use within an integrated circuit that has reduced power consumption.

DETAILED DESCRIPTION

In the following description, numerous specific details are provided to provide a thorough understanding of the embodiments of the invention. One skilled in the relevant art will recognize, however, that the invention can be practiced without one or more of the specific details, or with other methods, components, etc. In other instances, well-known structures or operations are not shown or described in detail to avoid obscuring aspects of various embodiments of the invention.

Reference throughout the specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout the specification are not necessarily all referring to the same embodiment. Furthermore, the particular features, structures, or characteristics may be combined in any suitable manner in one or more embodiments.

Conventional memory bus designs utilize a full swing signal when data is passed to and from the memory. Thus, for example, for advanced CMOS processes using 0.18 micron or 0.13 micron processes, the voltage representing a digital one may be 1.8 volts (or 1.3 volts in the 0.13 micron case). The voltage representing a digital zero is 0 volts. Because the voltage swing between a one or a zero being read out from the memory is 1.8 or 1.3 volts, this results in a large current consumption due to the capacitance of the bus. This is especially true for large memories. As detailed below, in contrast to the prior art, the memory bus of the present invention is implemented as a differential bus with a self-timing transmitter and receiver.

Figure 1:
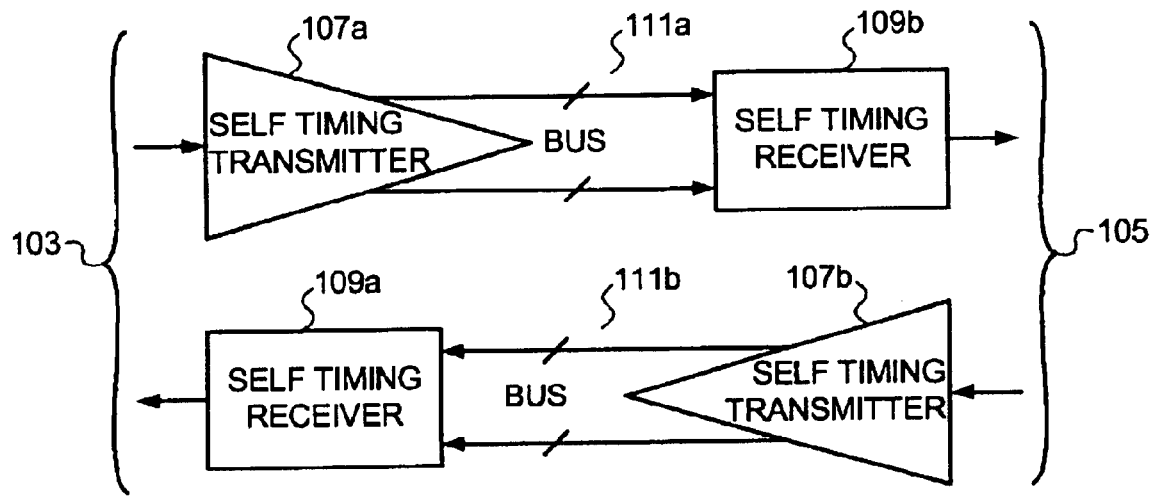
FIG. 1 is a schematic diagram of a memory bus formed in accordance with the present invention.

The memory bus 101 of the present invention is shown in FIG. 1. The memory bus 101 includes a first termination 103 and a second termination 105. Typically, the first termination 103 would be the memory resident on an integrated circuit, such as SRAM, DRAM, or the like. The second termination 105 would be, for example, a microprocessor, digital signal processor, or any other type of circuitry resident on the integrated circuit.

At the first termination 103, there is included a first self-timing transmitter 107a and a first self-timing receiver 109a. At the second termination 105, there is included a second self-timing transmitter 107b and a first self-timing receiver 109b. The first self-timing transmitter 107a is connected to the second self-timing receiver 109b by a first bus 111a. The second self-timing transmitter 107b is connected to the first self-timing receiver 109a by a second bus 111b.

The first self-timing transmitter 107a transmits data from the first termination 103 to the second self-timing receiver 109b of the second termination 105. Similarly, the second self-timing transmitter 107b transmits data from the second termination 105 to the first self-timing receiver 109a of the first termination 103.

FIG. 1 shows the simplest case where the bus is a single bit bus. However, in most applications, the bus is a multi-bit bus, such as a 16-bit bus or larger. Therefore, as will be apparent to one of ordinary skill in the art, the circuitry of FIG. 1 is repeated for each bit being carried by the memory bus.

In operation, the self-timing transmitters 107a and 107b receive as their input on a single line a voltage (an input signal) indicative of a data bit one or a data bit zero. In most embodiments, a data bit one is represented as a high voltage ($V_{dd}$) and a data bit zero is represented as a low voltage. However, the vice-versa arrangement may also be used, i.e., where a data bit one is represented by a low voltage and a data bit zero is represented by a high voltage.

As will be seen in greater detail below, the self-timing transmitters 107a and 107b are operative to translate the full swing signal on the single line input into a differential signal. The output of the self-timing transmitters 107a and 107b is carried on two output signal lines which each carry a voltage signal. A data signal one is signaled by having a first output signal line carry a high voltage (such as 1.8 volts or $V_{dd}$) and a second output signal line carry a lower voltage, but typically not ground. The lower voltage is dependent upon specific design parameters, but is in one embodiment typically on the order of 1.5–1.6 volts. The differential in voltage between the two output signal lines is made as small as possible, while still being large enough to be differentiable by the receiving circuitry.

It can be appreciated that the examples of voltages are merely to provide one example of appropriate voltages. In a more general sense, the voltages $V_{dd}$ and $V_{ss}$ may be used to represent high and low voltages of a integrated circuit. The voltages $V_{dd}$ and $V_{ss}$ will depend upon the specific processes used to manufacture the integrated circuit.

Moreover, with the differential bus, the precise voltages used are also variable and need not be tied to $V_{dd}$. Thus, if $V_{dd}$ is 1.8 volts, the lower and higher voltages carried on the two output signal lines may be, for example, 1.0 and 1.3 volts, respectively. However, in many implementations, $V_{dd}$ is used as one of the signal levels because of the convenience and readily available nature of $V_{dd}$.

Figure 2:
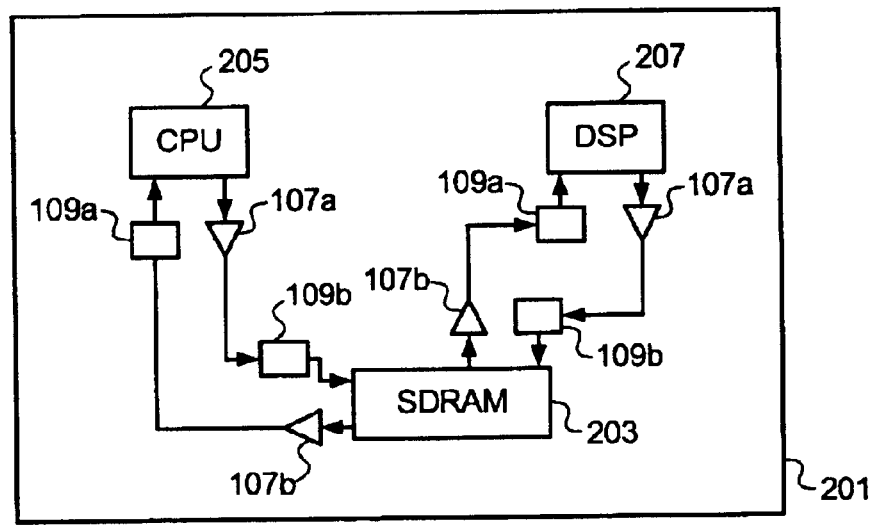
FIG. 2 is a schematic diagram of an integrated circuit utilizing the memory bus of the present invention.

FIG. 2 illustrates how the memory bus 101 of the present invention can be implemented in an integrated circuit 201. The memory bus 101 of the present invention is primarily directed to data communications internal to a single integrated circuit (also referred to as a single die). Thus, the integrated circuit 201 includes several discrete electrical components all resident on a single die. In the example shown in FIG. 2, the integrated circuit includes a SRAM 203, a CPU 205, and a digital signal processor 207. Other components may or may not be present on the integrated circuit, and the example of FIG. 2 is for illustration purposes only.

In order for the CPU 205 and the DSP 207 to communicate with the SRAM 203, a memory bus is coupled between the components. The memory bus is like that described in FIG. 1 and includes transmitters 107a and 107b and receivers 109a and 109b The memory bus 101 of FIG. 1 is advantageous from a power consumption viewpoint. The power consumption of the bus is proportional to the product of the bus capacitance ($C_{bus}$), the frequency of the operation (f), and the square of the voltage swing.

For a conventional bus, the voltage swing of the full swing signal is typically $V_{dd}$ when switching from a digital bit one to a digital bit zero, and or vice versa. Therefore, the power consumed is:

$$P=C_{bus}*f*V_{dd}^2$$

Because the bus of the present invention uses a differential voltage swing, the power consumption of the present invention is much less and is given by:

$$P=C_{bus}*f*\Delta V*V_{dd}$$

where $\Delta V$ is the voltage swing of the differential bus. In the example above, where $V_{dd}$ is 1.8 volts and the lower voltage is 1.5 or 1.6 volts, then $\Delta V$ is 0.3 or 0.2 volts. Therefore, the benefit of the present invention is a large power consumption savings which is equivalent to $\Delta V/V_{dd}$ compared to the conventional bus using full swing signals.

In other words, the circuit of the present invention utilizes differential sensing mode. The busses maintain a high potential $V_{dd}$ except during data writing mode. The small signal swing of the differential bus results in less current consumption. During the read/write mode, the bus signal is split to a small differential voltage signal. A receiver senses the bus signal by use of a differential amplifier.

Figure 3:
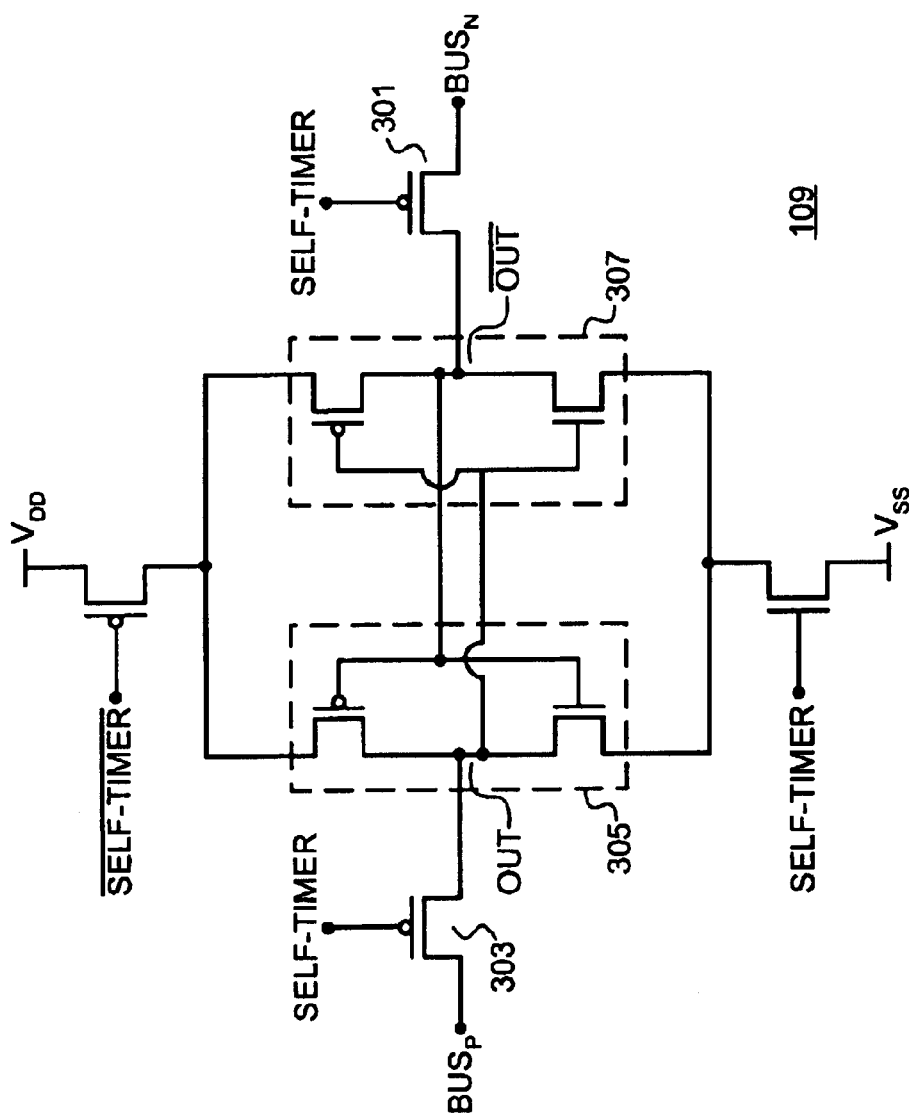
FIG. 3 is a schematic diagram of the self-timing receiver of FIG. 1.
Figure 4:
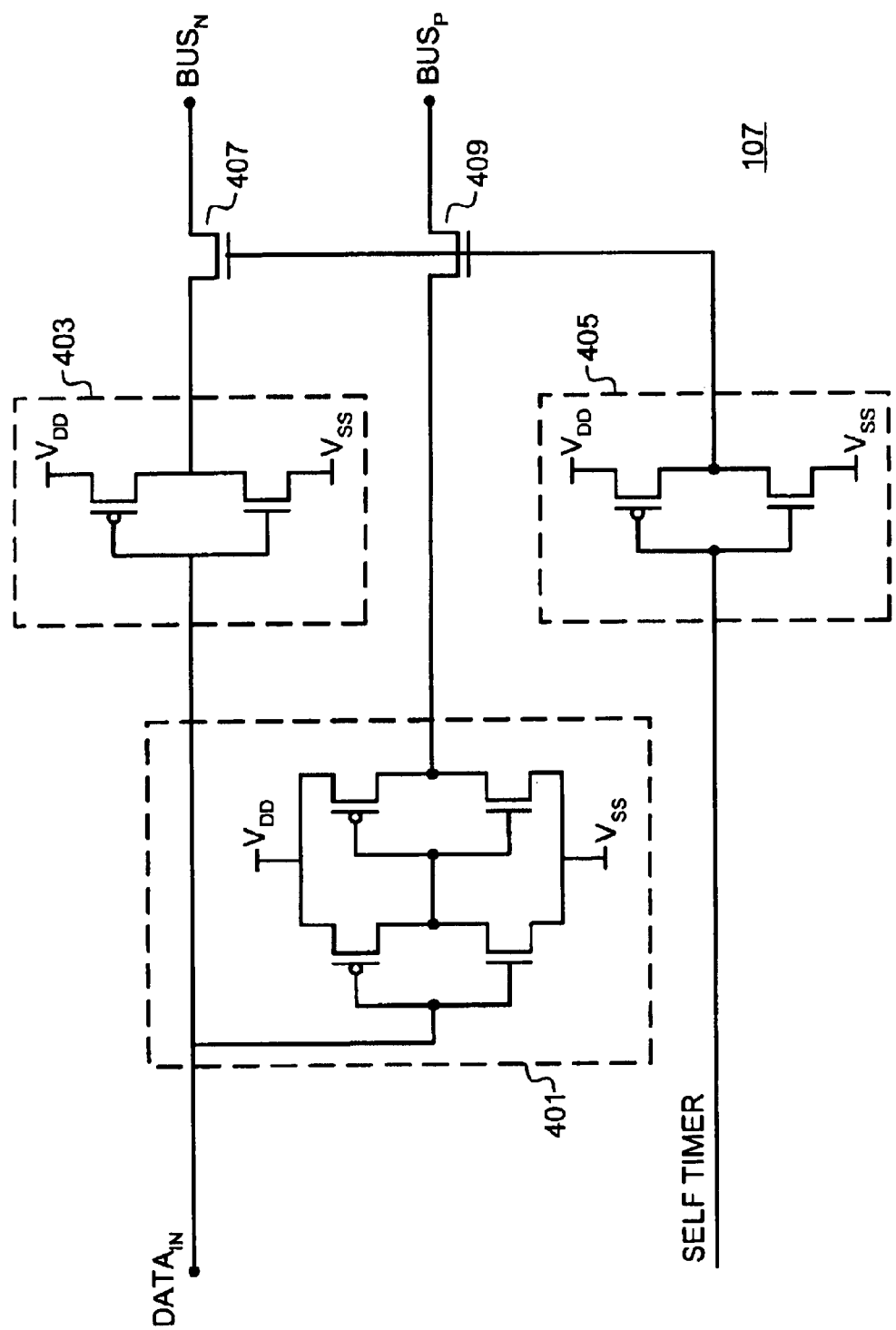
FIG. 4 is a schematic diagram of the self-timing transmitter of FIG. 1.

Turning next to FIGS. 3 and 4, the circuitry of the self-timing trasmitters 107a and 107b and the self-timing receivers 109a and 109b will next be described. Turning first to FIG. 4, a schematic diagram of self-timing transmitters 107a and 107b is shown. The transmitter 107 includes three main sections: a buffer 401, a first inverter 403, and a second inverter 405. The transmitter 107 receives digital data on line $Data_{in}$ and outputs digital data as a differential signal on lines $Bus_n$ and $Bus_p$. Additionally, a self-timer signal is provided to "clock" the transmitter.

The signal on $Data_{in}$ is either a logical one or logical zero, typically corresponding to $V_{hi}$ or $V_{lo}$. If a $V_{hi}$ is present on the $Data_{in}$ line, a low differential voltage $V_{ss}$ is output by the first inverter 403. However, if a $V_{lo}$ is present on the $Data_{in}$ line, a high differential voltage $V_{dd}$ is output by the first inverter 403. The voltages $V_{dd}$ and $V_{ss}$ are determined by design parameters. In one embodiment, $V_{dd}$ is 1.8 volts. $V_{ss}$ may be ground or some voltage between ground and $V_{dd}$. Moreover, note that will $V_{ss}$ is shown as the lower rail for the differential bus, the voltage $V_{ss}$ is rarely ever actually on the signal line, since the timing of the bus is faster than the time it takes for the voltage to drop to $V_{ss}$.

Further, if a $V_{hi}$ is present on the $Data_{in}$ line, a high differential voltage $V_{dd}$ is output by the buffer 401. The buffer 401 serves the purpose of amplifying (and stabilizing) the signal. However, if a $V_{lo}$ is present on the $Data_{in}$ line, a low differential voltage $V_{ss}$ is output by the buffer 401.

The outputs of the first inverter 403 and buffer 401 are provided to respective switches 407 and 409. The switches 407 and 409 are controlled by the self-timer signal through the second inverter 405. The second inverter 405 serves the purpose of amplifying (and stabilizing) the signal. When the self-timer signal is provided appropriately, the differential signal is output onto the $Bus_n$ and $Bus_p$. As seen, $Bus_n$ and $Bus_p$ will always be at the opposite voltage from each other.

Turning to FIG. 3, the schematic diagram of the self-timing receivers 109a and 109b is shown. Signals carried along $Bus_n$ and $Bus_p$ are provided as inputs to the receiver 109. The signals $Bus_n$ and $Bus_p$ are switched by switches 301 and 303, which are controlled by the self-timer signal that "clocks" the operation of the receiver 109. The signals $Bus_n$ and $Bus_p$ are provided to symmetrical inverters 305 and 307. The full swing digital output can be taken at the output node of the inverter 305. Further, because of the symmetrical nature of the circuit, a signal "bar" output (which is the inverse of the output signal) can be taken at the output node of the inverter 307.

From the foregoing, it will be appreciated that specific embodiments of the invention have been described herein for purposes of illustration, but that various modifications may be made without deviating from the spirit and scope of the invention. Accordingly, the invention is not limited except as by the appended claims. From the foregoing, it will be appreciated that specific embodiments of the invention have been described herein for purposes of illustration, but that various modifications may be made without deviating from the spirit and scope of the invention. Accordingly, the invention is not limited except as by the appended claims.

Thus, the above detailed descriptions of embodiments of the invention are not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. These and other changes can be made to the invention in light of the detailed description.

We claim:

1. A memory bus for communications between a memory and circuitry comprising:

a first self-timing transmitter associated with said memory for receiving a first input signal from said memory, said first self-timing transmitter operative to output a first differential output signal dependent upon said first input signal, wherein said first self-timing transmitter and comprises:
(a) a buffer that receives said first input and outputs a first differential voltage onto a first carrier bus ($Bus_p$);
(b) an inverter that inverts said first input and outputs a second differential voltage onto a second carrier bus ($Bus_n$) that is the inverse of said first input; and
(c) timing signal transistors located on said first carrier bus and second carrier bus that in response to a timing signal selectively allow said first differential voltage and second differential onto said first carrier bus and second carrier bus, respectively;

a second self-timing receiver associated with said circuitry adapted to receive said first differential output signal and operative to output a first received signal to said circuitry dependent upon said first differential output signal;

a second self-timing transmitter associated with said circuitry for receiving a second input signal from said circuitry, said second self-timing transmitter operative to output a second differential output signal dependent upon said second input signal, wherein said second self-timing transmitter and comprises:
(a) a buffer that receives said second input and outputs a first differential voltage onto a first carrier bus ($Bus_p$) of the second self-timing transmitter;
(b) an inverter that inverts said second input and outputs a second differential voltage that is the inverse of said second input onto a second carrier bus ($Bus_n$) of the second self-timing transmitter; and
(c) timing signal transistors located on said first carrier bus and second carrier bus of that second self-timing transmitter that in response to a timing signal selectively allow said first differential voltage and second differential onto said first carrier bus and second carrier bus of said second self-timing transmitter, respectively; and a first self-timing receiver associated with said memory adapted to receive said second differential output signal and operative to output a second received signal to said memory dependent upon said second differential output signal.

2. The memory bus of claim 1 wherein said memory and said circuitry are located on a single integrated circuit.

3. The memory bus of claim 1 wherein said first input signal is representative of a digital one or a digital zero.

4. The memory bus of claim 1 wherein said first received signal is the same as said first input signal.

5. The memory bus of claim 1 wherein said second received signal is the same as said second input signal.

6. The memory bus of claim 1 further including:
a first pair of signal lines connected between said first self-timing transmitter and said second self-timing receiver for carrying said first differential output signal; and
a second pair of signal lines connected between said second self-timing transmitter and said first self-timing receiver for carrying said second differential output signal.

7. The memory bus of claim 1 wherein said first input signal and said second input signal are full swing signals.

* * * * *